(12) United States Patent
Kato et al.

(10) Patent No.: US 6,372,650 B2
(45) Date of Patent: *Apr. 16, 2002

(54) METHOD OF CLEANING SUBSTRATE AND METHOD OF MANUFACTURING SEMICONDUCTOR DEVICE

(75) Inventors: Toshio Kato; Noboru Tokumasu, both of Tokyo (JP)

(73) Assignees: Canon Sales Co., Inc.; Semiconductor Process Laboratory Co., Ltd., both of (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/220,690

(22) Filed: Dec. 28, 1998

(51) Int. Cl.[7] .............................................. H01L 21/302
(52) U.S. Cl. ...................... 438/706; 438/694; 438/704; 438/745; 438/756; 438/906
(58) Field of Search ................................ 438/694, 700, 438/704, 706, 715, 720, 723, 745, 749, 750, 753, 754, 756, 778, 787, 906

(56) References Cited

U.S. PATENT DOCUMENTS

| 3,775,176 A | * | 11/1973 | Cross et al. | 427/353 |
| 5,712,198 A | * | 1/1998 | Shive et al. | 438/745 |
| 5,952,157 A | * | 9/1999 | Kato et al. | 430/329 |

FOREIGN PATENT DOCUMENTS

| JP | 2184311 | 7/1990 |
| JP | 5304126 | 11/1993 |
| JP | 7283192 | 10/1995 |
| JP | 11087291 | * 3/1999 |

OTHER PUBLICATIONS

JP 11–087291, Translation.*

* cited by examiner

Primary Examiner—Carl Whitehead, Jr.
Assistant Examiner—Maria Guerrero
(74) Attorney, Agent, or Firm—Lorusso & Loud (57) ABSTRACT

A method of cleaning a substrate is provided which can remove contamination after treatment of a substrate surface by use of chemicals etc. prior to film formation. The method of cleaning the substrate surface uses of a vapor of chlorosulfonic acid ($SO_2Cl(OH)$).

11 Claims, 7 Drawing Sheets

S or Cl-contained Treatment Liquid or Gas

FIG. 4C

TEOS(N₂) + O₃(O₂)

Vapor of Chlorosulfonic Acid

Vapor of Chlorosulfonic Acid

METHOD OF CLEANING SUBSTRATE AND METHOD OF MANUFACTURING SEMICONDUCTOR DEVICE

BACKGROUND OF THE INVENTION

1. Field of the Invention

The present invention relates to a method of cleaning a substrate and to a method of manufacturing a semiconductor device and, more particularly, to a method of cleaning a substrate and to a method of manufacturing a semiconductor device removing contaminants after working a surface of a substrate by chemicals etc., or treating the surface of the substrate by the chemicals, etc. prior to film formation.

2. Description of the Prior Art

In recent years, the prior art has mainly used a mixed solution consisting of sulfuric acid, hydrochloric acid, ammonium, hydrogen peroxide, etc. to clean a silicon wafer. Since metals and organic matters are removed, this cleaning method is effective.

A cleaning method using various steps to manufacture semiconductors in the prior art will now be explained with reference to FIGS. 1A and 1B which are sectional views showing steps of cleaning a surface of a semiconductor substrate 1 after trench grooves 3 have been formed in the semiconductor substrate 1.

Figure 1A:
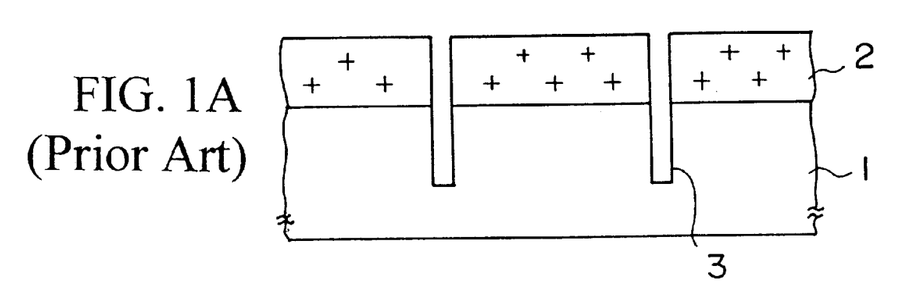
FIGS. 1A to 1B are sectional views showing steps of substrate cleaning according to a first prior art method.

As shown in FIG. 1A, the trench grooves 3 are first formed in the semiconductor substrate 1 using a resist film 2 as a mask. Then, the resist film 2 is removed by a resist removing liquid and, as shown in FIG. 1B, the semiconductor substrate 1 in which the trench grooves 3 are formed is exposed to a liquid such as sulfuric acid to remove contaminants such as resist removing liquid.

Figure 2A:
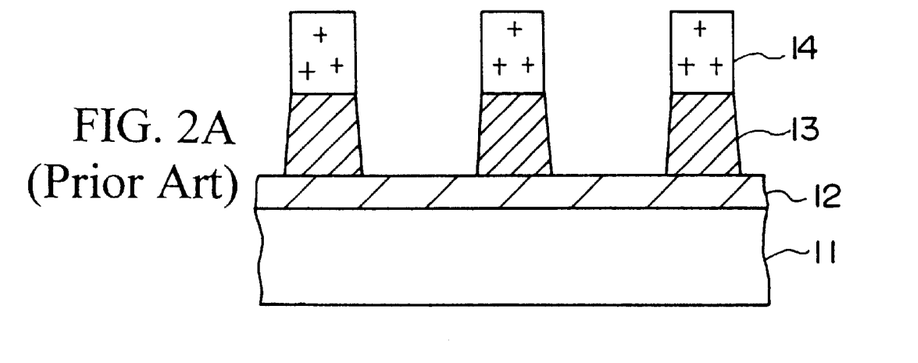
FIGS. 2A to 2C are sectional views showing steps of substrate cleaning according to a second prior art method.
Figure 2B:
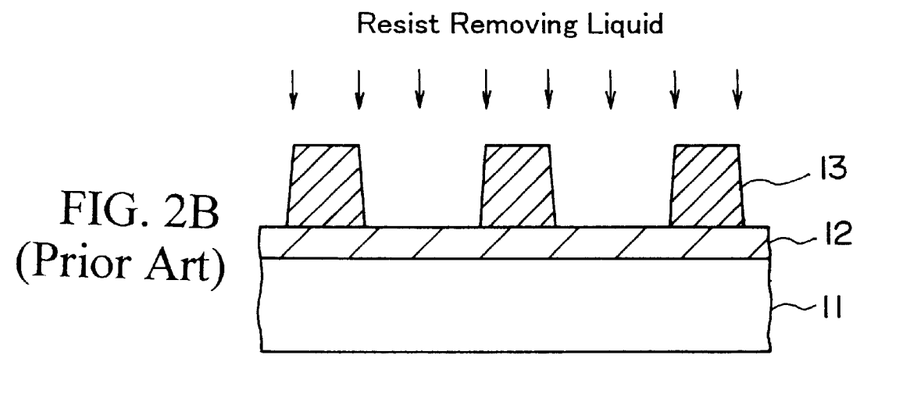

In the second step, as shown in FIG. 2A, a writing pattern 13 is first formed on an underlying insulating film 12 on a semiconductor substrate 11 by using the resist film 14 as a mask. Then, as shown in FIG. 2B, the resist film 14 is removed by the resist moving liquid. Then, as shown in FIG. 2C, an insulating film 15 is formed by the CVD method to cover the wiring 13 formed on the underlying insulating film 12.

Figure 3A:
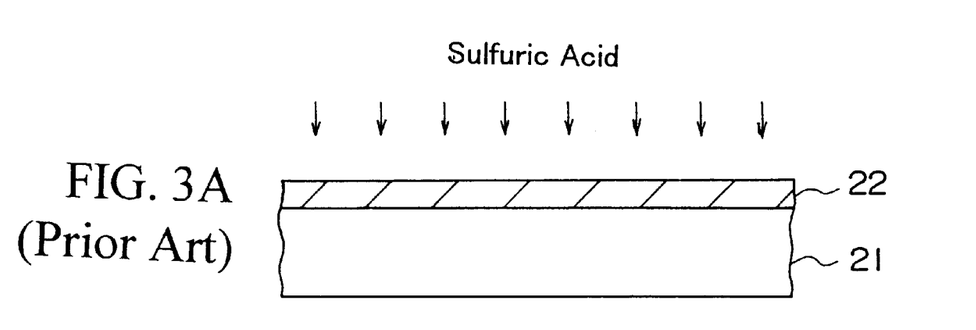
FIGS. 3A and 3B are sectional views showing steps of substrate cleaning according to third prior art method.

In the third step, as shown in FIG. 3A, a surface of the underlying insulating film 22 on semiconductor substrate 21 is first cleaned by a liquid, e.g. sulfuric acid, etc. Then, as shown in FIG. 3B, a silicon containing insulating film 23 is deposited on the underlying insulating film 22 by the thermal CVD method using a reaction gas including TEOS (for example, $N_2$ is employed as the carries gas) and ozone (which is included in the $0_2$ at the predetermined concentration).

Figure 1B:
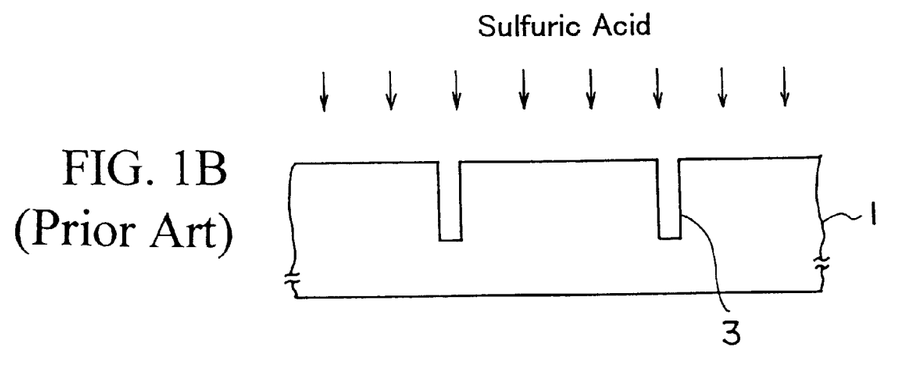

In the case of FIG. 1A and FIG. 1B, in recent years, with the progress of miniaturization of semiconductors, the opening of such a groove has become narrower and thus the ratio of depth to width of opening of the groove 3 (this ratio is called an aspect ratio) has become higher. Such an aspect ratio, at most, is five to eight. In the case of a groove which has a narrow opening width but a deep depth, in the chemical processing shown in FIG. 1B, it becomes difficult for the chemicals to reach the bottom of groove 3 and then difficult for the chemicals to be replaced by a pure water wash once the chemicals have entered into the groove. Thus, it is extremely difficult to completely clean the bottom and the side surfaces of the groove 3.

Figure 2C:
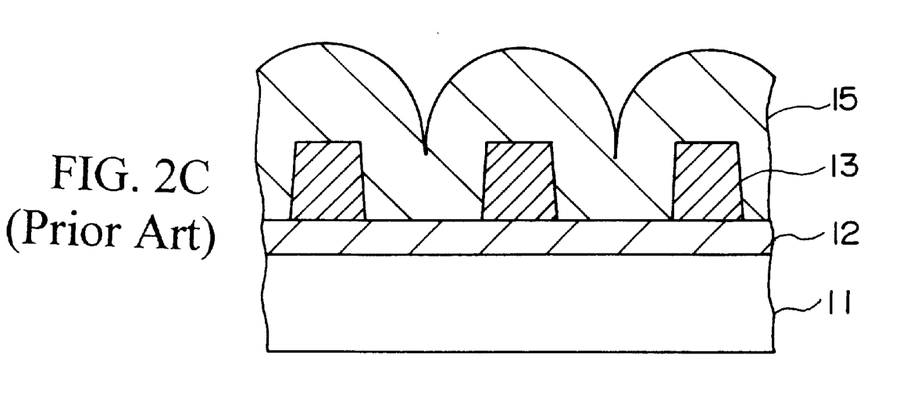

In the case of FIGS. 2A–2C, when the insulating film 15 is formed by the CVD method to cover the wiring 13 after surface treatment, it is difficult to deposit the insulating film 15 between the wire portions. As a result, as shown in FIG. 2C, deep hollows are sometimes produced between the wirings 13. If a conductive film is used to form an additional layer of wiring on insulating film 15, the conductive film cannot be satisfactorily deposited on such concave portions and the conductive film entering into the concave portions cannot be removed. If chemicals such as EKC (Trade name of EKC Company) is employed as the resist removing liquid, the growth rate of the $SiO_2$ film 15 is extremely slow on the concave surface portions when the film is formed by the CVD method, after the pre-treatment, so that the concave portions cannot be covered evenly. The cause of this problem, though not clearly analyzed, is perhaps that the EKC cannot be completely removed from the surface of the underlying insulting film 12 and the remaining EKC has an adverse influence upon the growth rate of the $SiO_2$ film 15.

Figure 3B:
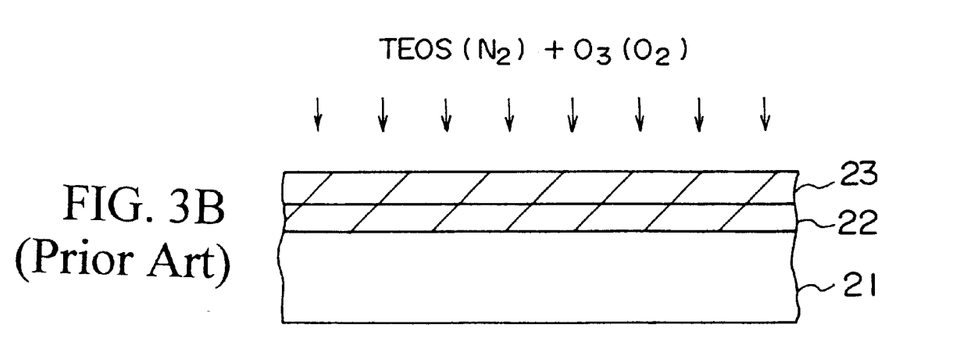

In the case of FIGS. 3A and 3B, there has been the problem that, when the film is formed on the insulating film 22, for example, a silicon thermal oxide film formed on the semiconductor substrate 21 by the thermal CVD method using a reaction gas including TEOS, the film forming rate is extremely slow on the insulating film 22 as compared with the case where the film is formed directly on the silicon substrate.

As the diameter of the wafer is enlarged from 200 mm to 300 mm, consumption of the chemicals is increased more and more. As a consequence, not only is the cost increased but also the drainage step takes an extreme amount of time, which creates environmental problems.

SUMMARY OF THE INVENTION

It is an object of the present invention to provide a substrate cleaning method capable of cleaning the interior of grooves having a narrow width and a deep depth, while reducing consumption of chemicals, and completely removing contaminants such as resist removing liquid, and forming a film on an insulating film with a desirable film forming rate.

In the present invention, a surface of a substrate is cleaned by use of a vapor including at least one of a vapor of sulfuric acid, a vapor of hydrochloric acid, a vapor of nitric acid and a vapor of chlorosulfonic acid ($SO_2Cl(OH)$).

Since the chemicals are employed in vapor phase, consumption of the chemicals can be greatly reduced as compared to the case where a liquid is employed.

In addition, since a vapor of the chemicals is employed, the chemicals are in molecular form so that the chemical can enter into a groove with a narrow width and a deep depth. Accordingly, bottoms and side walls of grooves having an opening width of less than 0.3 μm and a deep depth can be completely cleaned.

Further, as has been experimentally demonstrated contaminants which are hard to remove, for example, resist removing liquids, on the insulating film are completely removed by using a liquid or vapor of chlorosulfonic acid.

As also confirmed experimentally, when an insulating film is formed on the underlying insulating film by the thermal CVD method, substantially the same growth rate as that in the case where the film is formed directly on the semiconductor substrate is achieved, especially when using a liquid or vapor of chlorosulfonic acid.

DESCRIPTION OF THE PREFERRED EMBODIMENTS

Embodiments of the present invention will be explained with reference to the accompanying drawings.

(1) First Embodiment

FIGS. 4A to 4D are sectional views showing steps of a substrate cleaning method according to the first embodiment of the present invention. For samples processed with four types of chemicals and unprocessed samples, growth rates of the insulating films on an underlying insulating film are compared.

Figure 4A:
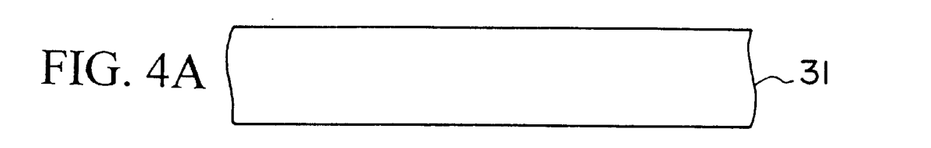
FIGS. 4A to 4D are sectional views showing steps of substrate cleaning according to a first embodiment of the present invention.

First, as shown in FIG. 4A, a p-type silicon substrate (semiconductor substrate) 31 having a resistivity of 5 Ω cm is prepared.

Figure 4B:
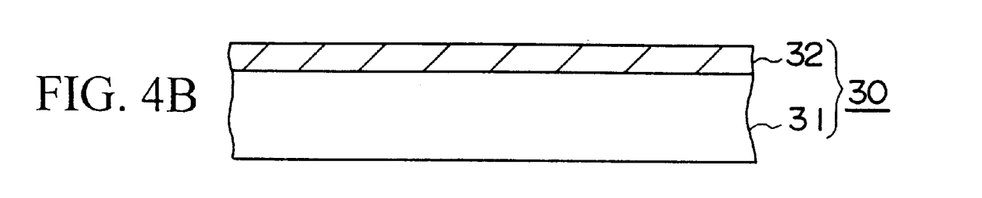

Then, as shown in FIG. 4B, the silicon substrate 31 is thermally oxidized at a temperature of 1100° C. in an oxygen atmosphere to form a silicon oxide film (underlying insulating film) 32 of about 100 nm in thickness on a surface of the silicon substrate 31 to form a substrate 30.

Figure 4C:
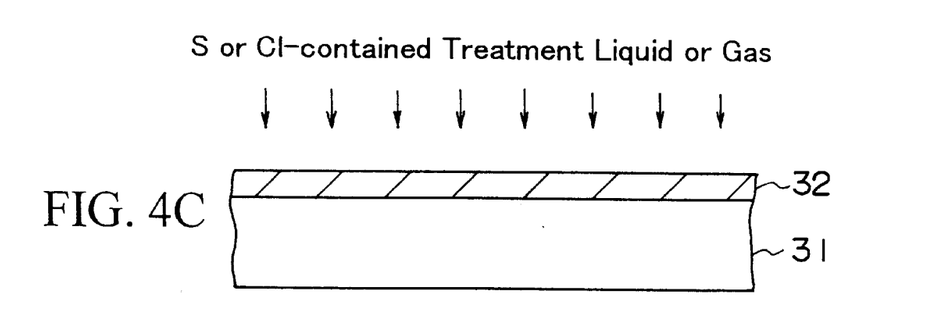

Then, as shown in FIG. 4C, the substrate 30 is cleaned by using cleaning chemicals or vapors of chemicals. In the experiments, four types of chemicals or vapors of chemicals were employed.

Figure 7:
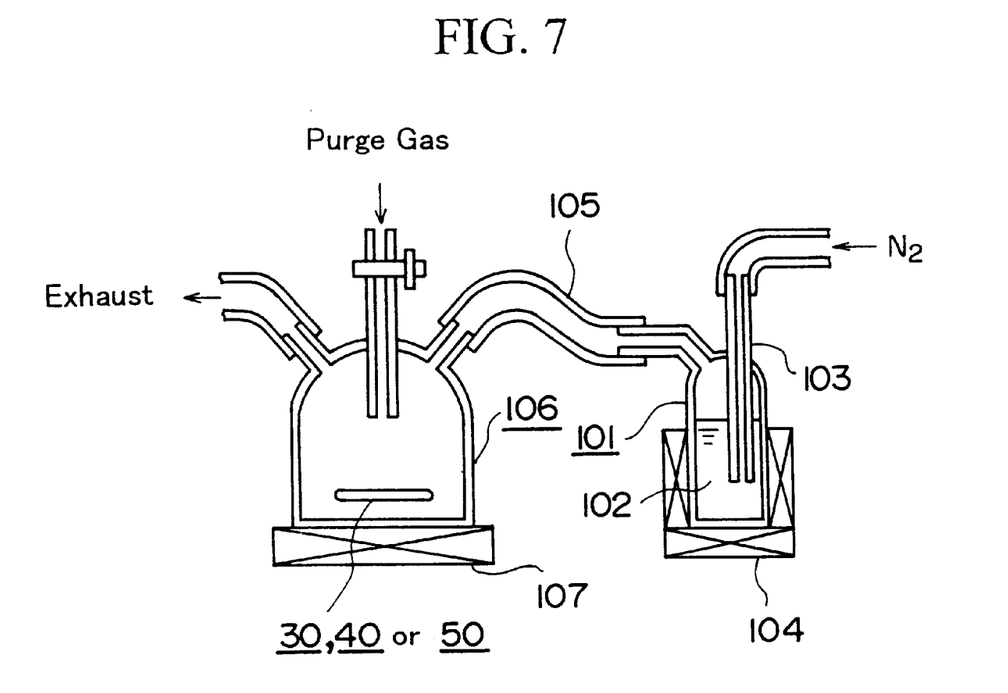
FIG. 7 is a schematic view showing chemical vapor supplying apparatus combined with a substrate processing apparatus according to the present invention.

A first sample was prepared as shown in FIG. 7 using chlorosulfonic acid ($SO_2Cl(OH)$) liquid 102 filling a flask 101 which was held at room temperature without heating. A nitrogen ($N_2$) carrier gas was passed through the chlorosulfonic acid ($SO_2Cl(OH)$) liquid 102, via a pipe 103 and then introduced via a pipe 105 into a chamber into which the substrate 30 has been loaded. Then, the nitrogen gas including the chlorosulfonic acid was directed onto a surface of the substrate 30 for thirty minutes. The temperature of the chlorosulfonic acid ($SO_2Cl(OH)$) liquid 102 was increased by heating by means of a heater 104.

A second sample was prepared by supplying sulfuric acid vapor directly from a sulfuric acid bomb and directed onto a surface of the to-be-processed substrate 30 for thirty minutes.

Then, third and fourth samples were prepared as follows. 30 cc of chlorosulfonic acid liquid was filled into two beakers. The liquid temperature in one beaker was held at room temperature, while the other beaker was heated to hold the liquid temperature at 58° C. Then, substrates 30 were immersed in the respective beakers for thirty minutes.

For comparison, a fifth sample which was not treated by the cleaning chemicals or vapor of the chemicals was also used.

In all cases, the substrates 30 were cleaned by a flow of pure water after the process was completed and then dried by blowing with nitrogen gas.

Figure 4D:
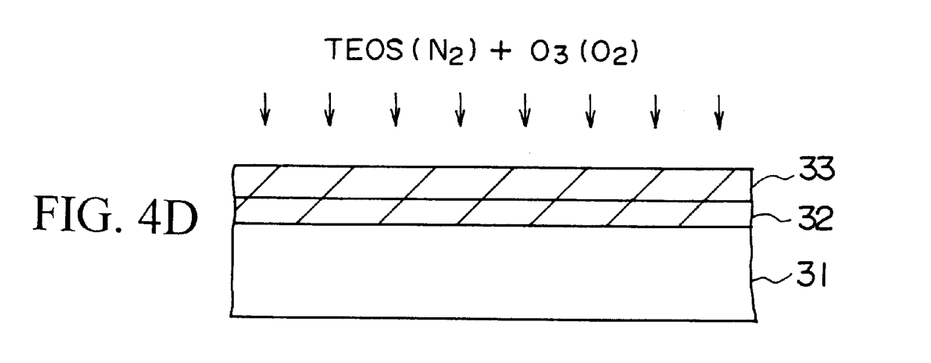

Next, under the conditions given in Table 1 below, as shown in FIG. 4D, another silicon oxide film (insulating film) 33 was formed on the silicon oxide film 32 (formed by thermal oxidation) by the thermal CVD method using the reaction gas given in Table 1.

TABLE 1

| Reaction gas condition: |
| --- |
| TEOS: 1 Sccm |
| $O_3$ in $O_2$: 120 g (mass of $O_3$ in 1 $m^3$ of $O_3 + O_2$), |
| Flow rate of $O_3 + O_2$: 7.5 sccm |
| Flow rate of $N_2$ (carrier gas): 18 sccm |
| Film forming temperature: 450° C. |

The results are given in Table 2 below. In Table 2, "growth rate" signifies a growth rate of the silicon oxide film 33, and the notation "ratio to Si" signifies a ratio of the growth rate of respective samples to the growth rate obtained when the film is formed directly on the silicon substrate, shown in percentages.

TABLE 2

| Processing Chemicals | Temp. (° C.) | Process Time (min.) | Growth rate (Å/min.) | Ratio to Si (%) |
| --- | --- | --- | --- | --- |
| Chlorosulfonic Acid vapor | room temp. | 30 | 470 | 104 |
| Hydrochloric Acid vapor | room temp. | 30 | 398 | 87 |
| Chlorosulfonic Acid liquid | room temp. | 30 | 491 | 103 |
| Chlorosulfonic Acid liquid | room temp. | 30 | 493 | 104 |
| None | — | — | 355 | 75 |

According to the results shown in Table 2, if the cleaning treatment utilizes either a liquid or vapor of chlorosulfonic acid, the growth rate was equal to or higher than the growth rate obtained when the film is formed directly on the silicon substrate.

As a result, the growth rate on the surface of the insulating film can be improved and therefore throughput can also be improved.

In addition, consumption of chemicals, a large amount of which is needed when used in liquid form, can be reduced significantly by employing vapor of the chemicals.

(2) Second Embodiment

Figure 5A:
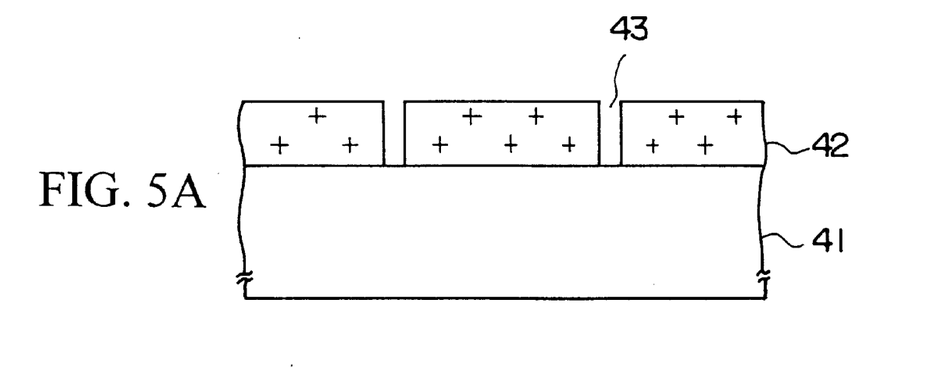
FIGS. 5A to 5C are sectional views showing steps of a substrate cleaning method accordingly to a second embodiment of the present invention.

First, as shown in FIG. 5A, a resist film 42 is formed on a silicon substrate (semiconductor substrate) 41 and then grooves 43 are formed in the resist film 42.

Then, the silicon substrate 41 is dry-etched via the grooves 43 using chlorine ($Cl_2$) to form grooves 44 each having a width of about 0.25 μm.

Figure 5B:
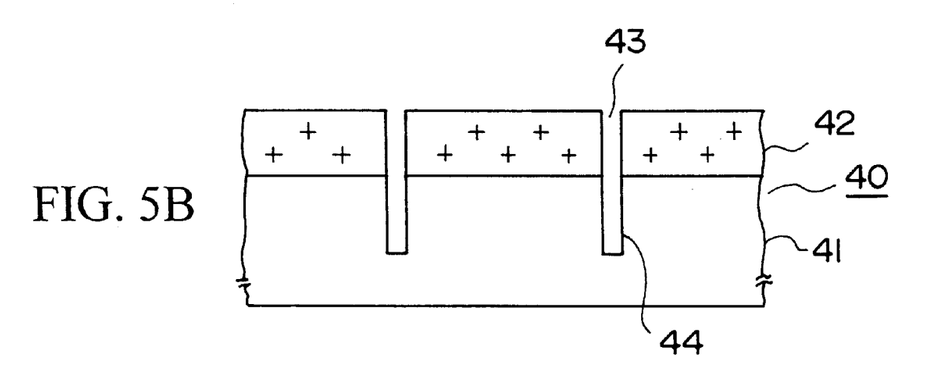

Next, as shown in FIG. 5B, the resultant structure is immersed in EKC as the resist removing liquid to remove the resist. With the above steps, a substrate 40 can be prepared. At this time, EKC liquid remains in the grooves 44.

Then, as shown in FIG. 7, a chlorosulfonic acid ($SO_2Cl(OH)$) liquid 102 is filled in the flask 101 and the liquid temperature is held at room temperature or the liquid temperature is increased by heating with the heater 104. The nitrogen used as the carrier gas is passed through the chlorosulfonic acid ($SO_2Cl(OH)$)) liquid 102 to thus form a nitrogen gas flow containing the chlorosulfonic acid. The nitrogen gas is then introduced into the chamber 106 via pipe 105. Then, the nitrogen gas containing the chlorosulfonic acid is directed onto a surface of the substrate 40 (FIG. 5C) in the chamber 106.

Figure 5C:
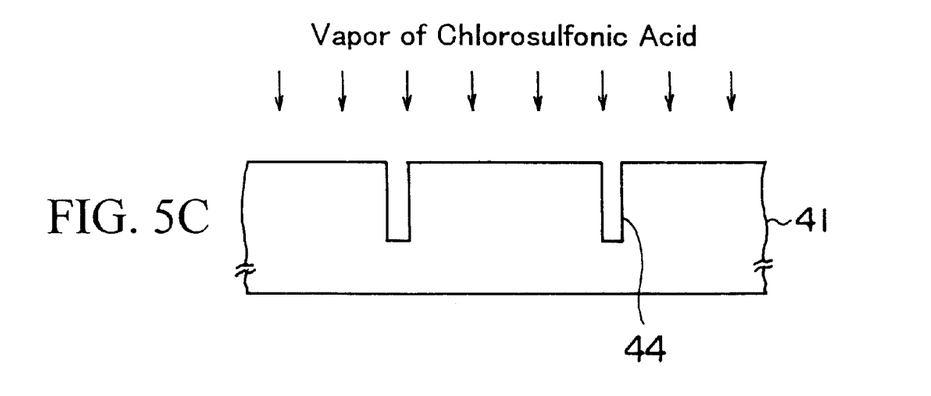

At that time, since the chlorosulfonic acid molecules can enter easily into the grooves 44, each having a narrow width and a deep depth, it can react with the EKC adhering to the bottoms and sidewalls of the grooves 44. Hence, all EKC remaining on the bottoms and side walls of the grooves 44 can be easily removed.

(3) Third Embodiment

Figure 6A:
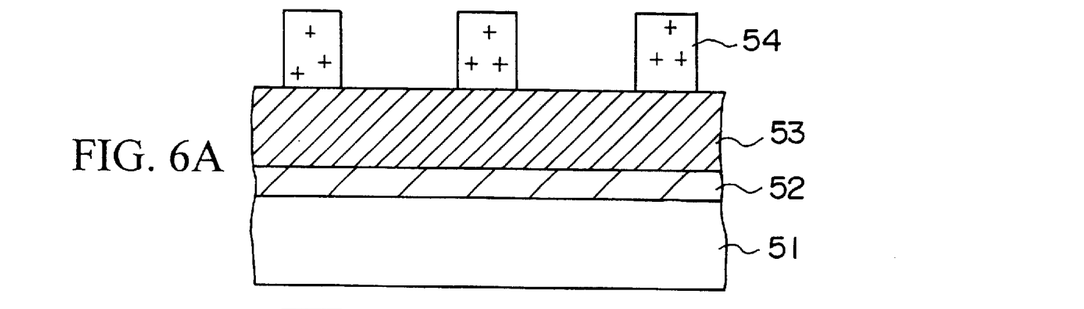
FIGS. 6A to 6D are sectional views showing steps of a substrate cleaning method according to a third embodiment of the present invention.
Figure 6B:
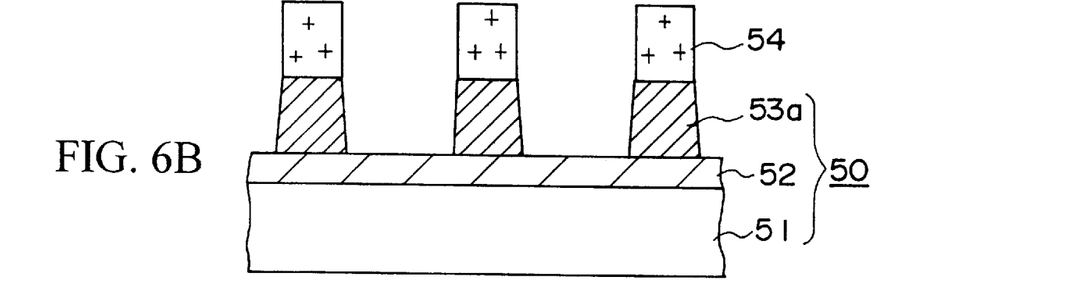

FIG. 6A is sectional view showing a structure before wiring is formed on the substrate. In FIG. 6A, 51 denotes a silicon substrate (semiconductor substrate); 52, a silicon oxide film (underlying insulating film) formed by thermal oxidation; 53, a conductive film made of aluminum which is formed on the silicon oxide film 52 to a thickness of 800 nm; and 54, a resist film formed on the conductive film to remain on the wiring forming regions.

Figure 6C:
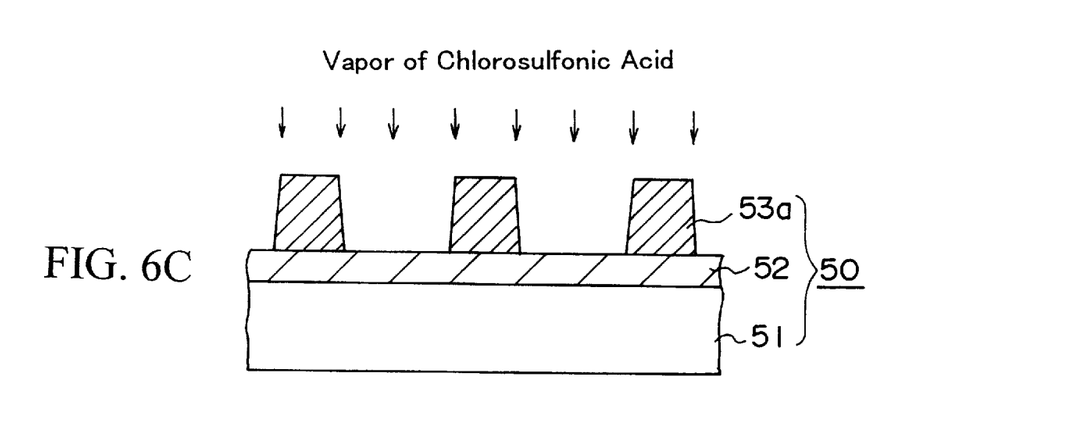

As shown in FIG. 6C, the conductive film 53 was first etched, using the resist film 54 as a mask, to form a plurality of conductors 53a each having a width of 0.5 $\mu$m with a distance of 1 $\mu$m between adjacent conductors 53a.

Then, as shown in FIG. 6C, a surface of the substrate 50 was cleaned by the vapor of the cleaning chemical. In other words, as shown in FIG. 7, the chlorosulfonic acid ($SO_2Cl(OH)$) liquid 102 was filled into the flask 101, and then held at room temperature or heated by the heater 104. Nitrogen gas as the carrier gas was passed through the chlorosulfonic acid ($SO_2Cl(OH)$) liquid 102 to thus form the nitrogen gas flow containing chlorosulfonic acid. Then, the nitrogen gas including the chlorosulfonic acid was directed onto a surface of the substrate 50 for two minutes.

For comparison, a sample which was not treated by cleaning chemical or the vapor of the chemical was provided.

In all cases, the substrates 50 were cleaned by a flow of pure water after the process and dried by blowing with nitrogen.

Figure 6D:
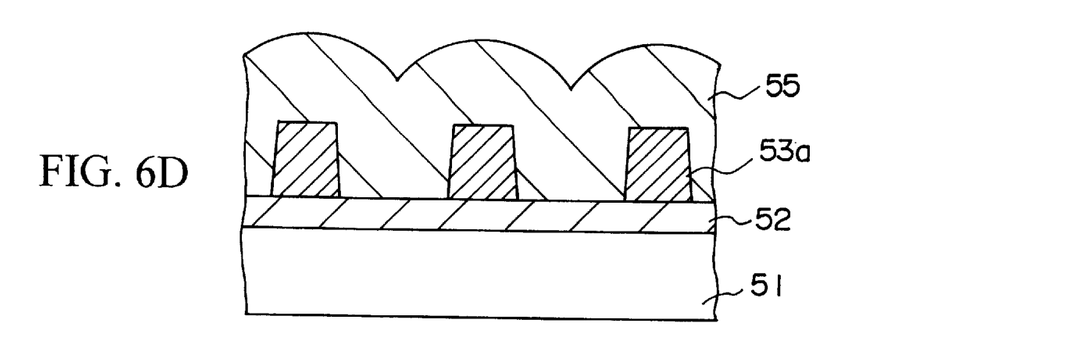

Next, under the conditions set forth in Table 3 below as shown in FIG. 6D, the thermal CVD method using the following reaction gas given in a Table 3, was used to form another silicon oxide film (insulating film) 55 to cover the wiring 53a.

TABLE 3

Reaction gas condition:

TEOS: 1 sccm
$O_3$ in $O_2$: 120 g (mass of $O_3$ in 1 $m^3$ of $O_3 + O_2$),
Flow rate of $O_3 + O_2$: 7.5 sccm
Flow rate of $N_2$ (carrier gas): 18 sccm
Film forming temperature: 450° C.

Sectional shapes of the insulating films obtained as described above to cover the wirings can be compared to each other with reference to FIGS. 6D and 2C. FIG. 6D is a sectional view showing a sample which was formed and cleaned by the cleaning method according to the present invention, and FIG. 2C is a sectional view showing the sample which has formed without treatment.

According to the results, in the case where surface treatment has been carried out using vapor of chlorosulfonic acid as shown in FIG. 6D, hollows of the concave portions between the wires 53a were made shallower in the sectional shape of the insulating film 55 than the case where no treatment was used as shown in FIG. 2C.

Consequently, a conductive film serving as an upper wiring layer can be formed normally on the hollowed portions on the surface of the insulating film 55. Also, since the depths of the hollow portions are shallow, the conductive film at the bottoms of the hollow portions can be completely removed when the conductive film once formed is to be patterned by etching.

The silicon substrate has been described as the semiconductor substrates 31, 41, 51, in the above first to third embodiments, but these substrates are not limited to a silicon substrate.

In addition, the silicon oxide film formed by the thermal oxidation has been described as the underlying insulating films 32, 52, but these underlying insulating films are not limited to a thermal silicon oxide film. A $SiO_2$ film, PSG film, BSG film, BPSG film, or other film formed by the thermal CVD method, or another CVD method may be employed.

The silicon oxide film has been described as the insulating films 33, 55, but these insulating films are not limited to silicon oxide. Moreover, the thermal CVD method using TEOS/$O_3$ has been described as a method of forming the insulating films 33, 55, but a thermal CVD method using another reaction gas or another CVD method may be employed. For example, the low pressure CVD method (LPCVD method) using an $SiH_4$—$N_2O$ reaction gas, the LPVCVD method using a TEOS-$O_2$ reaction gas, the plasma CVD method using the TEOS-$O_2$ reaction gas, or the plasma CVD method using an $SiH_4$—$O_2$ reaction gas may be utilized. Hence, the $SiO_2$ film, the PSG film, the BSG film, BPSG film, or the like formed by these CVD methods may be employed.

Since a vapor is employed, chemical molecules are available to enter into the interior of the grooves of narrow width and deep depth, so that it achieves a noticeable effect of removing contaminants.

Since a vapor is employed, consumption of the chemicals, a large quantity of which is needed if used in liquid form, can be greatly reduced.

Since the surface of the insulating film is treated by a liquid or vapor of chlorosulfonic acid ($SO_2Cl(OH)$) prior to the film formation, the growth rate on the surface of the insulating film can be improved and also throughput can be improved.

Treatment of the surface of the substrate with a liquid or vapor of the chlorosulfonic acid ($SO_2Cl(OH)$), before the insulating film is formed to cover the wiring, removes contaminants from the underlying insulating film and, as a consequence, the growth rate of the insulating film on the surface of the underlying insulating film becomes close to the growth rate of the insulating film on the surface of the silicon substrate itself.

As a result, since the growth rate of the insulating film on the underlying insulating film in the concave portions between the wiring portions can be improved and thus hollows in the insulating film formed on the concave portions can be reduced as much as possible, another wiring layer can be properly formed on the insulating film.

What is claimed is:

1. A method of manufacturing a semiconductor device comprising the steps of:

cleaning the surface of a substrate by use of a vapor including chlorosulfonic acid ($SO_2Cl(OH)$) alone, as the sole cleaning agent, wherein said substrate includes a semiconductor base and wherein the substrate surface subjected to cleaning is a surface of a silicon oxide insulating layer overlying the semiconductor base; and depositing an insulating film, by chemical vapor deposition, on the substrate which has been subjected to the cleaning.

2. A method of manufacturing a semiconductor device according to claim 1, wherein the substrate surface has grooves formed therein, each of the grooves having an opening of a width of less than 0.3 μm exposed at the surface of the substrate.

3. A method of manufacturing a semiconductor device according to claim 1, wherein the substrate surface includes wiring formed on the insulating film.

4. A method according to claim 1 wherein said chemical vapor deposition is by reaction of tetraethoxysilane and $O_3$ to form an insulating film on the substrate.

5. A method of manufacturing a semiconductor device according to claim 1, wherein the vapor is formed by passing a carrier gas through a liquid containing the chlorosulfonic acid.

6. A method of manufacturing a semiconductor device according to claim 5, wherein the liquid containing the chlorosulfonic acid is heated.

7. A method of manufacturing a semiconductor device comprising the steps of:

cleaning a surface of a substrate by use of a liquid containing chlorosulfonic acid alone, as the sole cleaning agent, wherein the substrate surface subjected to said cleaning is a surface of a silicon oxide insulating layer overlying a semiconductor base; and depositing an insulating film, by chemical vapor deposition, on the surface of the substrate which has been subjected to the cleaning.

8. A method of manufacturing a semiconductor device according to claim 7, wherein the substrate surface has grooves formed therein, each of the grooves having an opening of a width of less than 0.3 μm exposed at the surface of the substrate.

9. A method of manufacturing a semiconductor device according to claim 7, wherein the substrate surface includes wiring formed on the insulating film.

10. A method of manufacturing a semiconductor device according to claim 7, wherein the liquid containing chlorosulfonic acid has a temperature which is higher than room temperature.

11. A method according to claim 7 wherein said chemical vapor deposition is by reaction of tetraethoxysilane and $O_3$ to form an insulating film on the substrate.

* * * * *